US006809929B2

(12) United States Patent
Liu

(10) Patent No.: US 6,809,929 B2
(45) Date of Patent: Oct. 26, 2004

(54) HEAT SINK ASSEMBLY WITH RETAINING DEVICE

(75) Inventor: HeBen Liu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/346,968

(22) Filed: Jan. 17, 2003

(65) Prior Publication Data

US 2004/0066627 A1 Apr. 8, 2004

(30) Foreign Application Priority Data

Oct. 4, 2002 (CN) .......................................... 91215779 U

(51) Int. Cl.⁷ ................................................. H05K 7/20
(52) U.S. Cl. ....................... 361/704; 361/687; 361/709; 257/709; 257/710; 165/80.2
(58) Field of Search ........................ 361/687, 703–705, 361/709–712, 717–720; 257/706–727; 165/80.2, 80.3, 80.4, 165, 185; 174/16.3; 411/338–339, 512, 525–526, 508–510; 248/271, 505, 510; 24/453, 607, 627, 628, 458

(56) References Cited

U.S. PATENT DOCUMENTS 5,384,940 A * 1/1995 Soule et al. .................. 24/453
6,208,515 B1 * 3/2001 Klein ......................... 361/704
6,307,748 B1 * 10/2001 Lin et al. ..................... 361/704
6,412,546 B1 * 7/2002 Lin et al. .................... 165/80.3
6,496,374 B1 * 12/2002 Caldwell ..................... 361/709
6,611,431 B1 * 8/2003 Lee et al. .................... 361/719
2001/0010624 A1 * 8/2001 Katsui \* cited by examiner Primary Examiner—Michael Datskovsky
(74) Attorney, Agent, or Firm—Wei Te Chung

(57) ABSTRACT

A heat sink assembly having a retaining device includes a heat sink (30), a retention frame (10), a rectangular fastener (50), four pins (20), and four springs (40). The heat sink includes a base (32) defining four bores (38) therein. The frame is secured to a printed circuit board (60) around an electronic package (70), and defines a pair of through holes (16). A pair of posts (55) depends from opposite sides of the fastener. The pins are received through the bores of the base and in the fastener. The springs surround the pins respectively between the base and the fastener. The posts are deformably extended through the through holes thereby compressing the springs and sandwiching the base between the frame and the springs. The springs cooperatively provide evenly distributed pressing forces on the base. The heat sink is thus easily, firmly and evenly secured to the electronic package.

6 Claims, 3 Drawing Sheets

HEAT SINK ASSEMBLY WITH RETAINING DEVICE

BACKGROUND OF THE INVENTION

1. Field of the Invention

The present invention relates to heat sinks and their retention on heat-generating devices such as electronic packages, and more particularly to a heat sink assembly having a retaining device securely retaining the heat sink on a heat-generating device.

2. Description of Prior Art

Numerous modern electronic devices such as central processing units (CPUs) of computers generate large amounts of heat during operation. The heat must be efficiently removed from the CPU; otherwise, abnormal operation or damage may result. Typically, a retaining device attaches a heat sink on the CPU to remove heat therefrom.

A common kind of retaining device comprises a retention frame and a clip. The retention frame is mounted on a printed circuit board (PCB), and surrounds a CPU that is also mounted on the PCB. The retention frame forms a pair of ears at opposite sides thereof. The clip comprises a central pressing portion pressing a heat sink onto the CPU, and a pair of clamping legs depending from opposite ends of the pressing portion. The legs each define an opening therein, the openings of the legs engagingly receiving the ears of the retention frame. Thus, the heat sink is resiliently attached on the CPU to remove heat therefrom.

With the rapid development of electronics technology, CPUs are now able to process signals at unprecedented high speeds. As a result, CPUs can generate huge amounts of heat. To maintain an acceptably low operating temperature of a high-speed CPU, a heat sink must have great heat dissipation capability. A popular way to achieve this is to simply provide heat sinks that are larger and heavier than previously. However, many conventional retaining devices are not strong enough to securely retain a large, heavy heat sink on the CPU. The heat sink is liable to shift relative to the CPU when the assembly is subjected to vibration or shock during use. This can adversely affect the efficiency of heat removal. The heat sink may even disengage from the CPU altogether.

SUMMARY OF THE INVENTION

Accordingly, an object of the present invention is to provide a heat sink assembly having a retaining device which easily and securely fastens a heat sink on a heat-generating device such as an electronic package.

In order to achieve the object set out above, a heat sink assembly in accordance with a preferred embodiment of the present invention comprises a heat sink, a retention frame, a rectangular fastener, four pins and four springs. The heat sink comprises a base defining four bores therein. The frame is secured to a printed circuit board around an electronic package, and defines a pair of through holes. A pair of posts depends from opposite sides of the fastener. The pins are received through the bores of the base and in the fastener. The springs surround the pins respectively between the base and the fastener. The posts are deformably extended through the through holes thereby compressing the springs and sandwiching the base between the retention frame and the springs. The springs cooperatively provide evenly distributed pressing forces on the base. The heat sink is thus easily, firmly and evenly secured to the electronic package.

Other objects, advantages and novel features of the present invention will become more apparent from the following detailed description when taken in conjunction with the accompanying drawings, in which:

DETAILED DESCRIPTION OF THE INVENTION

Figure 1:
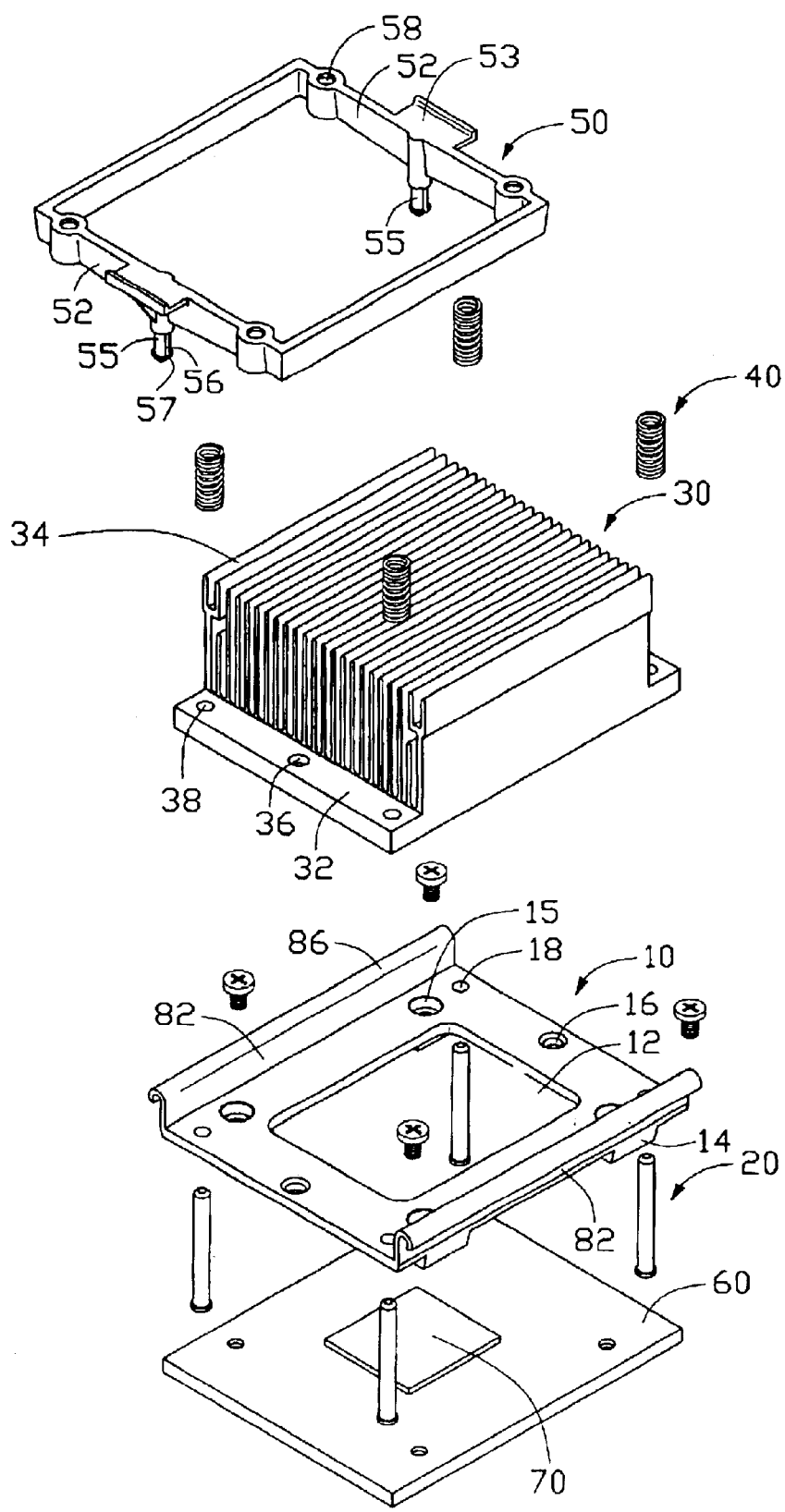
FIG. 1 is an exploded, isometric view of a heat sink assembly having a retaining device in accordance with a preferred embodiment of the present invention, together with an electronic package mounted on a printed circuit board (PCB)

Referring to FIG. 1, a heat sink assembly having a retaining device in accordance with a preferred embodiment of the present invention comprises a retention frame 10, four pins 20, a heat sink 30, four springs 40 and a fastener 50. The retaining device fastens the heat sink 30 to an electronic package 70 that is mounted on a printed circuit board (PCB) 60.

The heat sink 30 comprises a base 32, and a plurality of parallel fins 34 extending upwardly from the base 32. The base 32 comprises two exposed side portions at respective opposite sides of the plurality of fins 34. A first through hole 36 is defined in a middle of each said side portion. A pair of first bores 38 is defined in respective opposite ends of each said side portion, for insertion of corresponding pins 20 therethrough.

The retention frame 10 can be secured to the PCB 60 by a plurality of fastening means such as screws (not labeled). A rectangular opening 12 is defined in a central portion of the retention frame 10 for receiving the electronic package 70 therein. A pair of standoffs 14 depends from respective opposite ends of each of opposite sides of the retention frame 10, for contacting the PCB 60 and supporting the retention frame 10 thereon. A plurality of screw holes 15 is defined in the retention frame 10 around the opening 12, for insertion of screws (not labeled) therethrough to secure the retention frame 10 to the PCB 60. Four second bores 18 are defined in four corners of the retention frame 10 respectively, for insertion of the pins 20 therethrough. A pair of flanges 82 extends upwardly from respective opposite side edges of the retention frame 10, for facilitating positioning of the heat sink 30 on the retention frame 10. Each flange 82 outwardly forms a ridge 86 at an upper edge thereof. A pair of second through holes 16 is defined in the retention frame 10 at respective opposite sides of the opening 12. Each second through hole 16 lies equidistantly between the opposite flanges 82.

Figure 2:
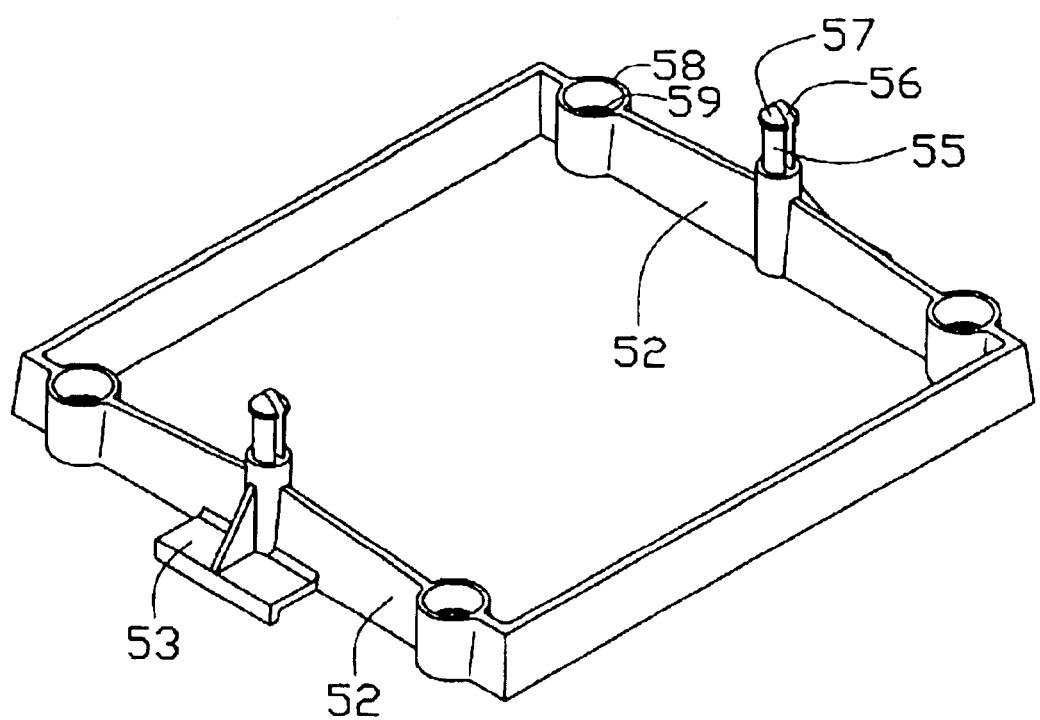
FIG. 2 is an inverted, isometric view of a retention frame of the retaining device of FIG. 1.

Referring also to FIG. 2, the fastener 50 is integrally formed as a single frame-like piece. The fastener 50 comprises a pair of opposite end walls 52. A pair of handles 53 extends perpendicularly outwardly from central top edges of the end walls 52 respectively, for facilitating operation of the fastener 50. A cylindrical post 55 depends from a central portion of each end wall 52. An enlarged, tapered cap 57 is formed at a distal end of each post 55. A longitudinal cutout 56 is defined in each cap 57 and an adjoining portion of the post 55. A pair of locating holes 58 is defined in respective opposite ends of each end wall 52. An annular step 59 is integrally formed with the respective end wall 52 inside each locating hole 58.

Figure 3:
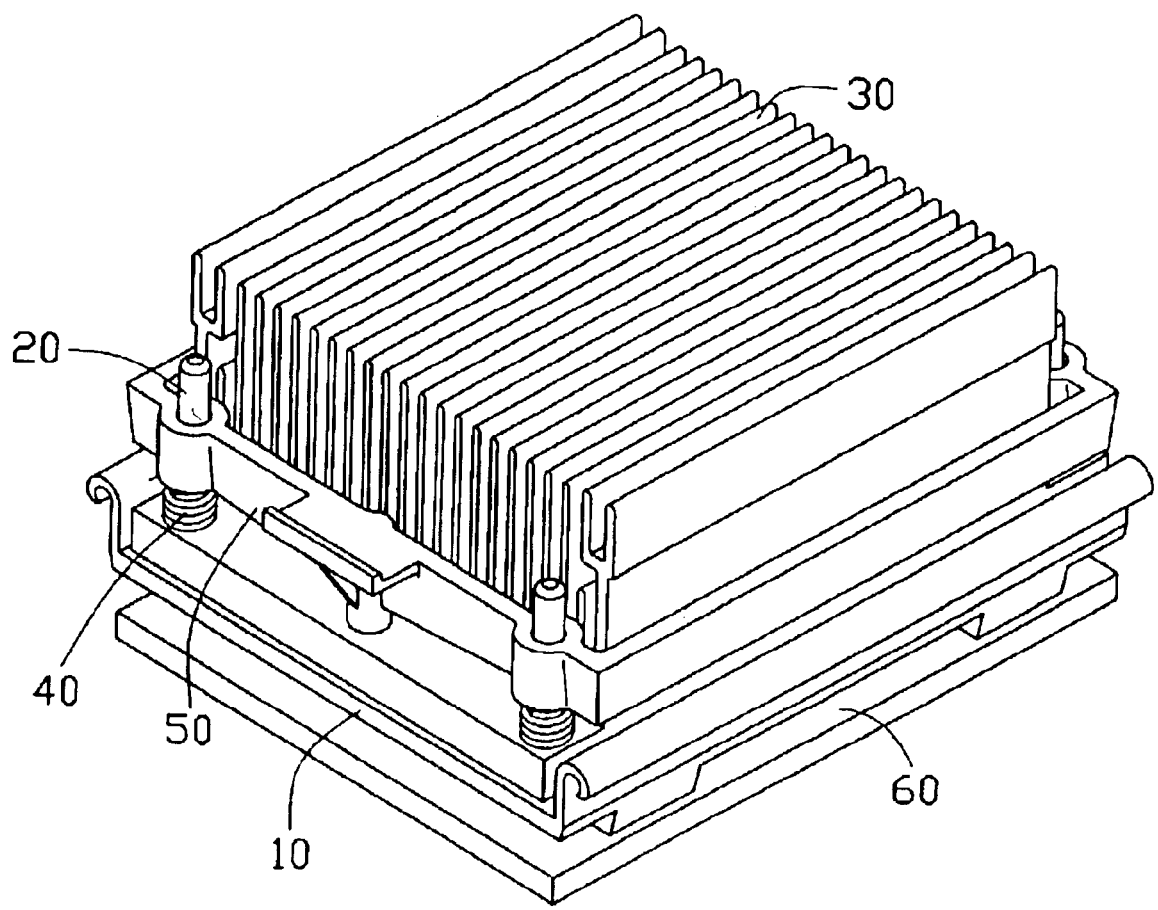
FIG. 3 is an assembled view of FIG. 1.

Referring also to FIG. 3, in assembly, the pins 20 are fittingly inserted through the second bores 18 of the retention frame 10. Then the retention frame 10 is secured to the PCB 60 with the screws (not labeled). The CPU 70 is thus received in the opening 12 of the retention frame 10. The pins 20 are further inserted through the first bores 38 of the heat sink 30. The heat sink 30 is thus positioned between the flanges 82 of the retention frame 10.

The springs 40 are placed over portions of the pins 20 that protrude above said exposed side portions of the base 32 of the heat sink 30. The fastener 50 is mounted on the heat sink 30. The locating holes 58 of the fastener 50 are aligned with the pins 20. The posts 55 of the fastener 50 are aligned with the first and second through holes 36, 16 respectively of the heat sink 30 and the retention frame 10.

The handles 53 of the fastener 50 are pressed down toward the base 32. The posts 55 of the fastener 50 are deformably received through the first and second through holes 36, 16. When the caps 57 of the posts 55 have completely passed through the second through holes 16, the posts 55 resiliently return back to their original undeformed states. The caps 57 thus clasp an underside of the retention frame 10. Simultaneously, the pins 20 are fittingly received through the locating holes 58 of the fastener 50. The springs 40 are thus sandwiched between said exposed side portions of the base 32 and the steps 59 in the locating holes 58 of the fastener 50. The springs 40 cooperatively provide evenly distributed pressing forces on the base 32. The heat sink 30 is thus easily, firmly and evenly secured to the electronic package 70.

In disassembly, the caps 57 of the posts 55 are each squeezed at the cutout 56. The posts 55 are pulled up free from the first and second through holes 36, 16, and the fastener 50 is pulled off of the heat sink 30. The heat sink 30 is then easily and safely detached from the electronic package 70.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, a discrete screw may replace the post (55) integrally formed with the fastener (50), initially extending through the fastener (50) and further through the first through hole (36), and finally screwing into the second through hole (16) so as to achieve an adjustable assembling among the retention frame (10), the heat sink (30) and the fastener (50) via the spring (40) and such a discrete screw.

What is claimed is:

1. A heat sink assembly comprising:

a printed circuit board;

an electronic package sub-assembly mounted on the printed circuit board;

a retention frame mounted on the printed circuit board and surrounding said electronic package sub-assembly;

a heat sink seated upon the electronic package sub-assembly;

a fastener located above the heat sink and downwardly pressing the heat sink via resiliency means; and rod type means vertically combining said fastener and said retention frame so as to have the heat sink tightly abut against the electronic package sub-assembly;

wherein a positioning pin extends through the fastener, the heat sink and the retention frame for vertical alignment so as to prevent transverse relative movement among the heat sink and the electronic package sub-assembly.

2. The assembly of claim 1, wherein said rod type means extends through the heat sink.

3. The assembly of claim 1, wherein said resiliency means is associated with said positioning pin.

4. The assembly of claim 1, wherein said retention frame defines a center opening for allowing one of said heat sink and said electronic sub-assembly to extend therethrough to engage the other.

5. The assembly of claim 1, wherein said electronic package sub-assembly is a chip directly soldered on the printed circuit board.

6. A heat sink assembly comprising:

a printed circuit board;

an electronic package sub-assembly mounted on the printed circuit board;

a retention frame mounted on the printed circuit board and surrounding said electronic package sub-assembly;

a heat sink seated upon the electronic package sub-assembly;

a fastener located above the heat sink and downwardly pressing the heat sink via resiliency means; and rod type means vertically combining said fastener and said retention frame so as to have the heat sink tightly abut against the electronic package sub-assembly; wherein said resiliency means is not coaxially associated with said rod type means but with a positioning pin extending at least between said fastener and said heat sink.

* * * * *